US006529047B2

United States Patent
Prentice

(10) Patent No.: US 6,529,047 B2
(45) Date of Patent: Mar. 4, 2003

(54) MIXER DRIVER CIRCUIT

(75) Inventor: John S. Prentice, Palm Bay, FL (US)

(73) Assignee: Intersil Americas Inc., Irvine, CA (US)

( * ) Notice: Subject to any disclaimer, the term of this patent is extended or adjusted under 35 U.S.C. 154(b) by 0 days.

(21) Appl. No.: 09/911,060

(22) Filed: Jul. 21, 2001

(65) Prior Publication Data

US 2002/0079947 A1 Jun. 27, 2002

Related U.S. Application Data

(60) Provisional application No. 60/257,664, filed on Dec. 21, 2000.

(51) Int. Cl.[7] .................................................. H03F 3/45
(52) U.S. Cl. ............................. 327/52; 327/55; 327/65; 327/563
(58) Field of Search .......................... 327/359, 52, 55, 327/65, 90, 356, 563; 326/18; 330/252, 300

(56) References Cited

U.S. PATENT DOCUMENTS

| 4,902,984 A | * | 2/1990 | Vinn et al. | 330/252 |
|---|---|---|---|---|
| 5,399,988 A | * | 3/1995 | Knierim | 330/149 |
| 5,475,328 A | * | 12/1995 | Kimura | 327/351 |
| 5,532,637 A | * | 7/1996 | Khoury et al. | 327/359 |
| 5,751,190 A | * | 5/1998 | Nguyen et al. | 330/54 |
| 5,774,020 A | * | 6/1998 | Kimura | 330/252 |
| 6,040,731 A | * | 3/2000 | Chen et al. | 327/359 |
| 6,111,463 A | * | 8/2000 | Kimura | 330/254 |
| 6,114,909 A | * | 9/2000 | Anzai et al. | 330/259 |
| 6,194,947 B1 | * | 2/2001 | Lee et al. | 327/359 |

* cited by examiner

Primary Examiner—Timothy P. Callahan
Assistant Examiner—Hai L. Nguyen
(74) Attorney, Agent, or Firm—Gary R. Stanford

(57) ABSTRACT

A mixer driver circuit including a differential pair, a differential current supply and a switched current sink. The differential pair has a differential input for receiving a differential input signal. The differential current supply provides a differential output and switches in response to switching of the differential pair to provide a differential output current. The switched current sink biases the differential current supply and sinks current to drive the differential output signal. The differential pair may be a resistive-loaded differential pair of transistors biased by a constant current sink. The differential current supply may include a pair of emitter follower buffers. The mixer driver may further include a pair of constant current sinks and a second pair of emitter follower buffers, where the second pair of emitter follower buffers is biased by the pair of constant current sinks and provides a voltage level shifting drive for the switched current sink.

20 Claims, 3 Drawing Sheets ns of differential output d switches in response to switching of the different pair to provide a differential output current. The switched current sink biases the differential current supply and sinks current to drive the differential output signal.

MIXER DRIVER CIRCUIT

CROSS-REFERENCE TO RELATED APPLICATION(S)

The present application is based on U.S. Provisional Patent Application entitled "Mixer Driver Circuit", Ser. No. 60/257,664, filed Dec. 21, 2000, which is hereby incorporated by reference in its entirety. The present application is related to U.S. Patent Application entitled "A Calibrated DC Compensation System For A Wireless Communication Device Configured In A Zero Intermediate Frequency Architecture", Ser. No. 09/677,975, filed Oct. 2, 2000, which is hereby incorporated by reference in its entirety.

DESCRIPTION OF RELATED ART

The bipolar junction transistor (BJT) differential pair is often used as the key element in a mixer cell. The input signal is a current applied to the emitters of the differential pair of transistors. A differential voltage applied between the bases switch the transistors so that one is turned on while the other is off and vice-versa. The output signal is the collector current or the differential collector current of both of the transistors. The output current includes mixing products that contain frequency components at the sum and difference frequencies between the input emitter current and the differential voltage applied to the bases. For radio frequency (RF) mixers, the differential voltage signal applied at the bases is usually a local oscillator (LO) signal.

The ideal differential voltage applied to the bases of differential pair mixer cells is just large enough to switch one of the pair off (but no larger) with very fast transitions, i.e., short rise and fall switching times. Excessively large voltage levels of the LO signal, however, result in common mode currents at a frequency of twice the LO frequency, which is not desirable. Switching times that are too slow increase the mixer cell noise figure, which is also not desirable.

The ideal LO mixer driver would generate a square wave with a peak-to-peak voltage of $4V_T$ to $8V_T$, where $V_T$ is a thermal coefficient voltage (the voltage equivalent of temperature). In particular, $V_T=kT/q$, where "k" is the Boltzmann constant in joules per degree Kelvin, T is the temperature in degrees Kelvin (absolute scale), and "q" is the magnitude of the charge of an electron. Resistively loaded differential pairs form a type of limiting amplifier that is often used. In a particular embodiment, for example, the differential pair includes a pair of NPN bipolar junction transistors, Q1 and Q2, having their emitters coupled together and to a current sink that sinks a bias current $I_{BIAS1}$ to ground. The collector of each of the transistors Q1 and Q2 is coupled to one end of a respective one of two load resistors R1 and R2. The other ends of the resistors are coupled to a supply voltage $V_{Supply}$. A low level LO signal, such as a sine wave or the like, applied between the bases of the differential pair switches one transistor on and the other transistor off. The "off" transistor's collector is pulled up to the supply voltage. The "on" transistor's collector voltage is below the supply voltage by an amount equal to the current/resistance (IR) drop across the corresponding load resistor. Therefore, the amplitude of the resulting square wave is 2IR, where I is the value of the current sink ($I_{BIAS1}$) biasing the differential pair and R is the value of one of the collector load resistors (R1 or R2).

The mixer can be driven by the collector voltages, $V_{OUT+}$ and $V_{OUT-}$ of the transistors Q1 and Q2, respectively. The input to the mixer cell is capacitive. The switching times, therefore, are limited by the current available to charge and discharge the input capacitance. With the differential pair completely switched, the positive going output has net output drive current limited by the resistive value of the collector load resistors. The negative going output has net output drive current, which is initially equal to the current of the current sink. As soon as the voltage begins to drop, however, the negative going output is equal to the difference between the current sink current and the collector load resistor current. To increase the switching times, the resistors had to be smaller and the current sink current had to be larger.

A modification of the above-described mixer driver is the addition of a pair of emitter follower NPN bipolar junction transistors Q3 and Q4 having their respective bases connected to respective collectors of the differential pair Q1, Q2. The collectors of the transistors Q3 and Q4 are coupled to $V_{Supply}$ and each emitter is coupled to a respective constant current sink drawing a constant bias current $I_{BIAS2}$ to ground. These flat emitter followers, therefore, have constant current sink biasing. The voltage swing is still set by the resistor IR drop. The emitter followers can supply a lot of current to pull the mixer cell input positive. The resistors may still limit the switching speed, however, because the emitter follower base capacitance has to be charged up before these followers can supply excess current. Also, for the negative going output, the maximum current available to drive the mixer cell is the emitter follower current sink current ($I_{BIAS2}$).

SUMMARY OF THE INVENTION

A mixer driver circuit according to an embodiment of the present invention includes a differential pair, a differential current supply and a switched current sink. The a differential pair has a differential input for receiving a differential input signal. The differential current supply provides a differential output and switches in response to switching of the differential pair to provide a differential output current. The switched current sink biases the differential current supply and sinks current to drive the differential output signal.

The differential pair may be a resistive-loaded differential pair of transistors biased by a constant current sink. The differential current supply may include a pair of emitter follower buffers. The mixer driver may further include a pair of constant current sinks and a second pair of emitter follower buffers, where the second pair of emitter follower buffers is biased by the pair of constant current sinks and provides a voltage level shifting drive for the switched current sink. The switched current sink may be biased by a constant current source and have a pair of control inputs coupled to respective polarities of the differential output. Alternatively, the control inputs of the switched current sink are coupled to respective polarities of the differential input of the differential pair.

The mixer driver circuit may further include a second differential current supply that operates to switch the switched current sink based on switching of the differential pair. In one embodiment, the switched current sink has first and second control inputs, and the second differential current supply includes a pair of emitter follower buffers. Each of the emitter follower buffers is biased by a constant current source, has a control input driven by the differential pair and has a current output for driving a respective control input of the switched current sink.

In a more specific embodiment, the differential pair includes first and second bipolar junction transistors (BJTs). The bases of the differential pair of transistors receive first and second polarities, respectively, of a differential input signal. The mixer driver circuit includes a first current sink, first and second bias resistors, third and fourth BJTs and a switched current sink. The first current sink is coupled between the common emitters of the first and second BJTs and a reference signal. The first and second resistors are each coupled between a voltage source and a collector of a corresponding one of the first and second BJTs. The third BJT has a collector coupled to the voltage source, a base coupled to the collector of the first BJT and an emitter for providing a first polarity of a differential output signal. The fourth BJT has a collector coupled to the voltage source, a base coupled to the collector of the second BJT and an emitter for providing a second polarity of the differential output signal. The switched current sink is coupled to the emitters of the third and fourth BJTs, biases the third and fourth BJTs relative to the reference signal and sinks current to drive the differential output signal.

In one embodiment, the switched current sink includes fifth and sixth BJTs and a second current sink. The fifth BJT has a collector coupled to the emitter of the fourth BJT and a base coupled to the emitter of the third BJT. The sixth BJT has a collector coupled to the emitter of the third BJT, a base coupled to the emitter of the fourth BJT and an emitter coupled to the emitter of the fifth BJT. The second current sink is coupled between the common emitters of the fifth and sixth BJTs and the reference signal. In an alternative embodiment, the switched current sink includes substantially the same components except that the base of the fifth BJT is coupled to the base of the first BJT and the base of the sixth BJT is coupled to the base of the second BJT.

In yet another alternative embodiment, the mixer driver circuit may further include a third resistor having a first end coupled to the second end of the first resistor and a second end coupled to the collector of the first BJT, and a fourth resistor having a first end coupled to the second end of the second resistor and a second end coupled to the collector of the second BJT. The mixer driver circuit may further include a fifth BJT having a collector coupled to the voltage source and a base coupled to the collector of the first BJT, and a second current sink coupled between the emitter of the fifth BJT and the reference signal. The mixer driver circuit may further include sixth BJT having a collector coupled to the voltage source and a base coupled to the collector of the second BJT, and a third current sink coupled between the emitter of the sixth BJT and the reference signal. The switched current sink may include a seventh BJT having a collector coupled to the emitter of the fourth BJT and a base coupled to the emitter of the fifth BJT, and an eighth BJT having a collector coupled to the emitter of the third BJT, a base coupled to the emitter of the sixth BJT and an emitter coupled to the emitter of the seventh BJT. Also, a fourth current sink is coupled between the common emitters of the seventh and eighth BJTs and the reference signal. In any of these embodiments, the reference signal may be ground.

A mixer driver circuit as described herein switches a capacitive load, such as a mixer cell or the like, faster for a given supply current because the output is a push-pull type arrangement which supplies a net output current quicker. The loading at the input differential pair is also reduced.

BRIEF DESCRIPTION OF THE DRAWINGS

A better understanding of the present invention can be obtained when the following detailed description of embodiments of the invention is considered in conjunction with the following drawings, in which.

DETAILED DESCRIPTION OF EMBODIMENT(S) OF THE INVENTION

Figure 1:
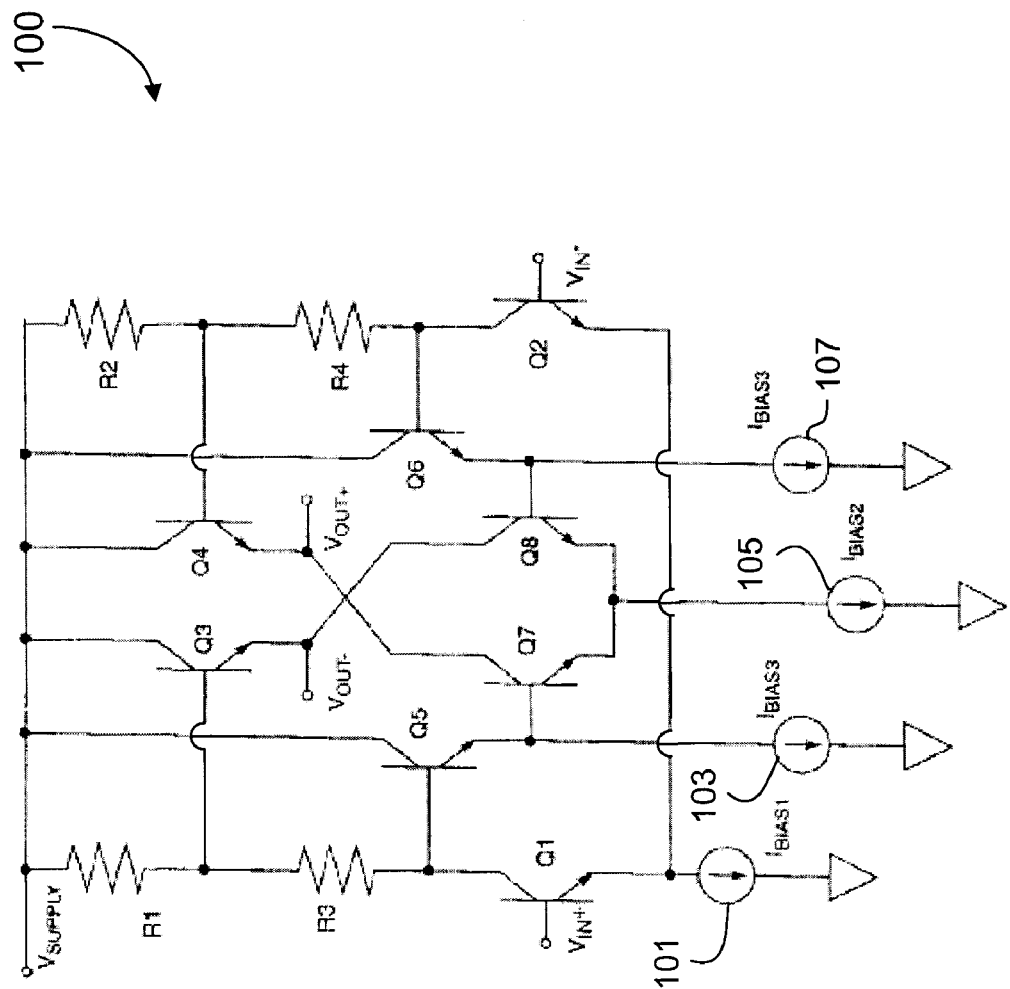
FIG. 1 is a schematic diagram of an exemplary mixer driver circuit implemented according to one embodiment of the present invention.

FIG. 1 is a schematic diagram of an exemplary mixer driver circuit 100 implemented according to one embodiment of the present invention. A pair of NPN bipolar junction transistors (BJTs) Q1 and Q2 form a differential pair having their emitters coupled together and to one terminal of a current sink 101. The other terminal of the current sink 101 is coupled to a common reference signal and draws a constant bias current $I_{BIAS1}$. In the embodiment shown, the common reference signal is ground, although it is understood that any other common reference signal or voltage level is contemplated. The collector of the transistor Q1 is coupled to one end of a resistor R3 and to the base of another NPN BJT Q5. The other end of the resistor R3 is coupled to one end of a resistor R1 and to the base of another NPN BJT Q3. The other end of the resistor R1 and the collectors of the transistors Q5 and Q3 are coupled to a voltage supply signal $V_{Supply}$. The emitter of the transistor Q5 is coupled to the base of another NPN BJT Q7 and to one end of a current sink 103, having its other end coupled to ground. The current sink 103 draws a constant bias current $I_{BIAS3}$ to ground. The collector of the transistor Q2 is coupled to one end of a resistor R4 and to the base of another NPN BJT Q6. The other end of the resistor R4 is coupled to one end of a resistor R2 and to the base of another NPN BJT Q4. The other end of the resistor R2 and the collectors of the transistors Q4 and Q6 are coupled to the $V_{Supply}$ signal. The emitter of the transistor Q6 is coupled to the base of another NPN BJT Q8 and to one end of a current sink 107, having its other end coupled to ground. The current sink 107 draws a constant bias current $I_{BIAS3}$ to ground.

The emitters of the transistors Q7 and Q8 are coupled together and to one end of a current sink 105, having its other end coupled to ground. The current sink 105 draws a constant bias current $I_{BIAS2}$ to ground. The emitter of the transistor Q3 is coupled to the collector of the transistor Q8 and the emitter of the transistor Q4 is coupled to the collector of the transistor Q7. A differential input voltage $V_{IN+}$, $V_{IN-}$ is applied to the bases of the transistors Q1, Q2, respectively. A differential output signal $V_{OUT+}$, $V_{OUT-}$ develops at the collectors of the transistors Q7, Q8, respectively. The differential input voltage $V_{IN+}$, $V_{IN-}$ may be a local oscillator (LO) signal, although any type of differential input signal is contemplated.

In operation, the transistors Q3 and Q4 operate as output emitter follower buffers that are biased by a switched current sink that includes the transistors Q7 and Q8. In particular, the transistors Q7 and Q8 switch the $I_{BIAS2}$ current of the current sink 105 between output emitter followers Q3 and Q4. A second pair of emitter follower buffers formed by the transistors Q5 and Q6 provide a voltage level shifting drive for the transistors Q7 and Q8. When the input differential voltage $V_{IN+}$, $V_{IN-}$ goes from negative to positive, Q1 turns on and Q2 turns off. The resistors R2 and R4 pull the bases of the transistors Q4 and Q6 to a more positive potential thereby turning them on. The base voltage of the transistor Q8 is also pulled positive turning it on. At the same time, the collector current of the transistor Q1 pulls the bases of the transistors Q3 and Q5 to a more negative potential thereby initially turning them both off. The transistor Q5 stays off until the next transition, whereas Q3 turns back on as described below. The base voltage of the transistor Q7 is also pulled negative turning it off.

After the following positive to negative switching transition in which the input differential voltage $V_{IN+}$, $V_{IN-}$ goes from positive to negative, a differential capacitive load, such as a mixer cell or the like, requires little drive current so that the transistor Q4 is biased on at $I_{BIAS2}$. As the base of the transistor Q4 goes positive, it continues to source current at this level because of its base-to-emitter capacitance. At the same time, the transistor Q7 is turning off which results in a net current flowing out into the capacitive load. The current out of the transistor Q4 increases above the $I_{BIAS2}$ value and then after the mixer cell has been switched, reduces down to whatever low level is required to hold the load high. Initially, the transistor Q3 is off and as its base goes negative, it would otherwise tend to stay off due to its base-to-emitter capacitance. The transistor Q8 is turning on, however, resulting in a net current being pulled out of the capacitive load. After the load has been switched, the collector current from the transistor Q8 turns on the transistor Q3.

The values of the resistors R1 and R2 plus the current $I_{BIAS2}$ set most of the peak-to-peak voltage swing. The base-to-emitter voltages of the emitter follower transistors Q3 and Q4 are also a factor as these voltages are no longer constant since their bias currents switch. The addition of the resistors R3 and R4 increases the voltage drive to the differential pair of transistors Q7 and Q8 and is used to optimize the switching timing between transistor pairs Q7, Q8 and Q3, Q4. The increase in voltage swing helps compensate for the added delay through the transistors Q5 and Q6. Also if the mixer driver circuit 100 is being toggled at speeds near the transistor switching times, the percentage of output voltage amplitude due to the base-to-emitter voltage differential ($\Delta V_{BE}$) of the transistors Q3 and Q4 (i.e. large base current transients flowing through the internal base resistance) enables reduced resistance values of the resistors R1 and R2. In that case, the additional resistors R3 and R4 are provided to completely switch the transistors Q7 and Q8.

The mixer driver circuit 100 switches a capacitive load, such as a mixer cell or the like, faster for a given supply current because the output is a push-pull type arrangement that supplies a net output current more quickly than previously known mixer driver circuits. In particular, the emitter follower transistors Q3 and Q4 switch out of phase with respect to the switched current sink transistors Q7 and Q8. The loading at the collectors of the transistors Q1 and Q2 is reduced because the transient base current of the emitter follower transistors Q3 and Q4 is reduced.

The emitter follower transistors Q3 and Q4 collectively operate as a differential current supply that drives the differential output $V_{OUT+}$, $V_{OUT-}$ in cooperation with the switched current sink formed by the transistors Q7 and Q8 and the current sink 105. For example, when the transistor Q1 is turned on and the transistor Q2 is turned off in response to the differential input $V_{IN+}$, $V_{IN-}$ going positive, the transistor Q4 is turned on (and the transistor Q3 is initially turned off) while the transistor Q7 is turned off so that the transistor Q4 supplies current at the $V_{OUT+}$ node. Meanwhile, the transistor Q8 is turned on to sink current from the $V_{OUT-}$ node via the current sink 105. In the opposite polarity when the transistor Q2 is turned on and the transistor Q1 is turned off in response to the differential input $V_{IN+}$, $V_{IN-}$ going negative, the transistor Q3 is turned on (and the transistor Q4 is initially turned off) while the transistor Q8 is turned off so that the transistor Q3 supplies current at the $V_{OUT-}$ node. Meanwhile, the transistor Q7 is turned on to sink current from the $V_{OUT+}$ node via the current sink 105.

The emitter follower transistors Q5 and Q6 collectively operate as a differential current supply that drives the switched current sink including the transistors Q7 and Q8. In particular, when the transistor Q1 is turned off, the transistor Q5 is turned on to provide current drive to switch on the transistor Q7. Likewise, when the transistor Q2 is turned off, the transistor Q6 is turned on to provide current drive to switch on the transistor Q8.

Figure 2:
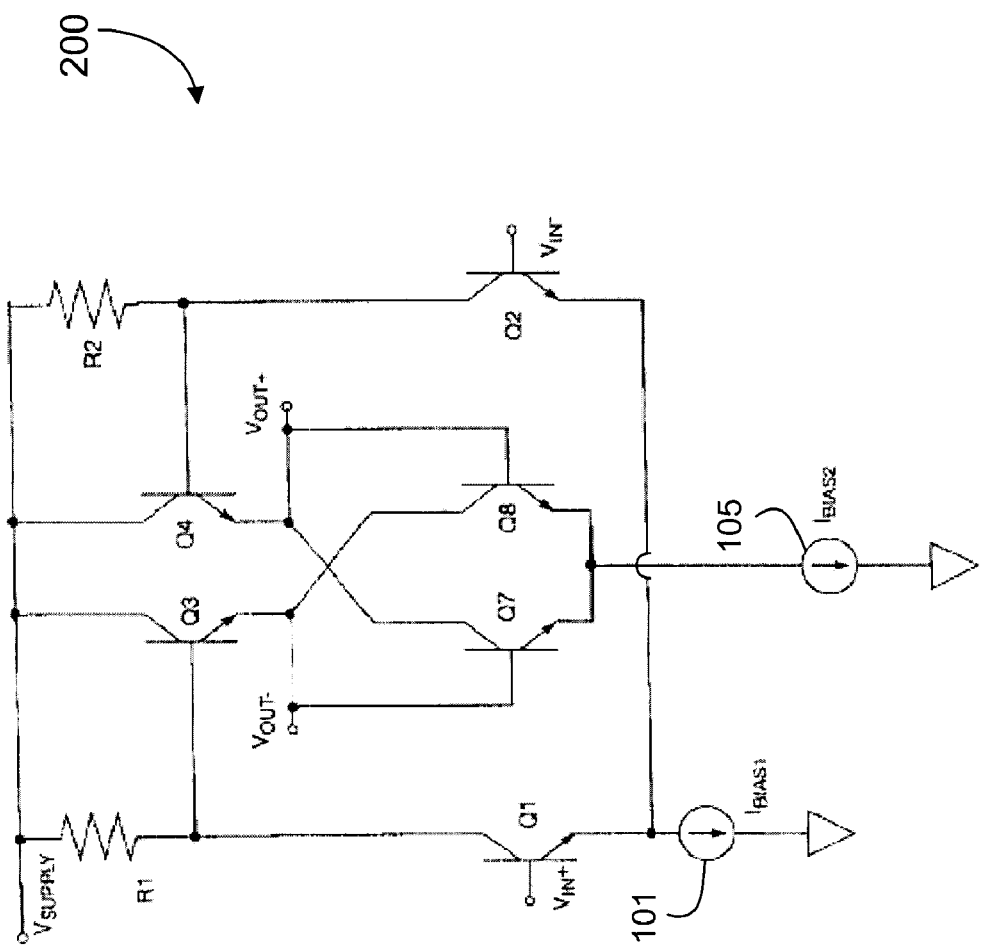
FIG. 2 is a schematic diagram of another exemplary mixer driver circuit implemented according to an alternative embodiment of the present invention.

FIG. 2 is a schematic diagram of another exemplary mixer driver circuit 200 implemented according to an alternative embodiment of the present invention. The mixer driver circuit 200 is similar to the mixer driver circuit 100, except that the resistors R3 and R4, the transistors Q5 and Q6 and the current sinks 103, 107 are eliminated. The resistor R1 is coupled to the collector of the transistor Q1 and the resistor R2 is coupled to the collector of the transistor Q2. Also, the base of the transistor Q7 is coupled to the emitter of the transistor Q3 (at the $V_{OUT-}$ signal) and the base of the transistor Q8 is coupled to the emitter of the transistor Q4 (at the $V_{OUT+}$ signal). The mixer driver circuit 200 is suitable for some applications, except that the transistors Q7 and Q8 do not switch until after the transistor Q3 and Q4 switch.

Figure 3:
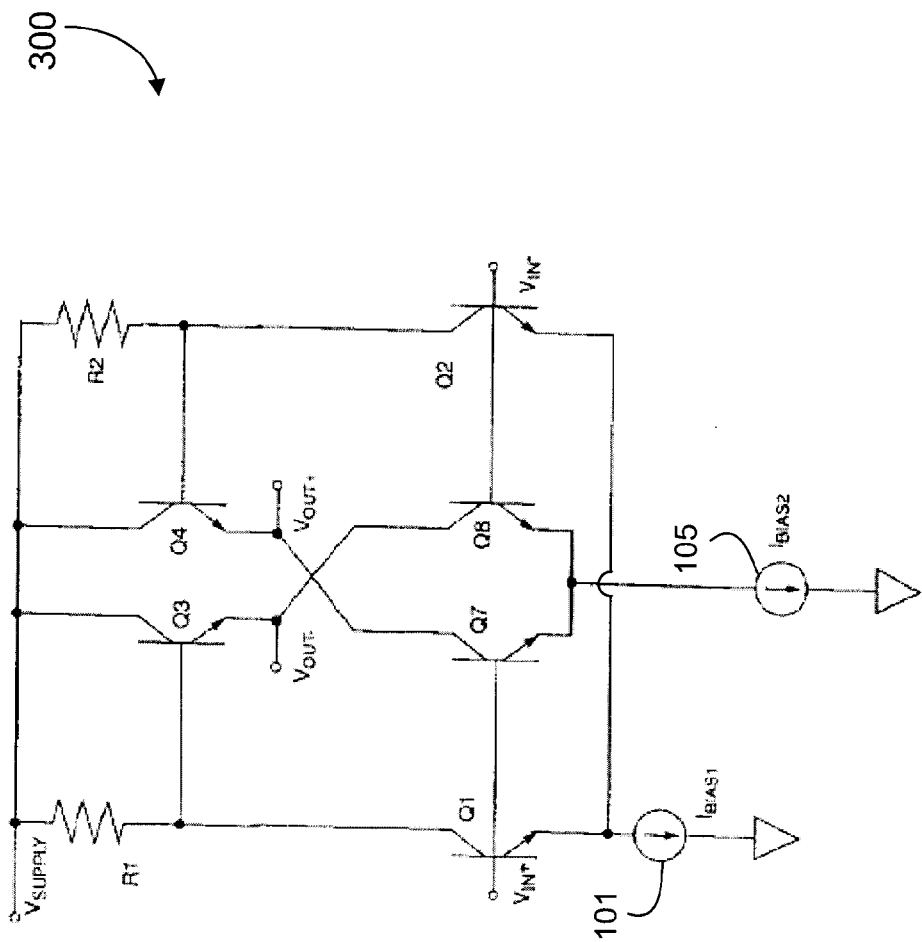
FIG. 3 is a schematic diagram of another exemplary mixer driver circuit implemented according to another alternative embodiment of the present invention.

FIG. 3 is a schematic diagram of another exemplary mixer driver circuit 300 implemented according to another alternative embodiment of the present invention. The mixer driver circuit 300 is similar to the mixer driver circuit 200, except that the base of the transistor Q7 is instead coupled to the base of the transistor Q1 (at the $V_{IN+}$ signal) and the base of the transistor Q8 is coupled instead to the base of the transistor Q2 (at the $V_{IN-}$ signal). The mixer driver circuit 300 is suitable for applications in which the circuit driving the $V_{IN+}$, $V_{IN-}$ input signals has an amplitude sufficient to switch a differential pair and sufficient current drive. If so, then the transistors Q7 and Q8 of the mixer driver circuit 300 begin to switch before the transistors Q3 and Q4 due to the delay of the signal going through the transistors Q1 and Q2.

Although a system and method according to the present invention has been described in connection with one or more embodiments, it is not intended to be limited to the specific form set forth herein, but on the contrary, it is intended to cover such alternatives, modifications, and equivalents, as can be reasonably included within the spirit and scope of the invention as defined by the appended claims. For example, although embodiments of the present invention have been illustrated with bipolar junction transistors, the invention may be implemented with other technologies, such as PNP bipolar junction transistors, metal oxide semiconductor (MOS) type circuits, field-effect transistors (FETs), etc.

What is claimed is:

1. A mixer driver circuit, comprising:
   a differential pair having a differential input for receiving a differential input signal that alternately switches transistors of the differential pair on and off;
   a differential current supply, coupled to the differential pair and resistively biased via a voltage source, that provides a differential output voltage signal sufficient to drive a mixer input, and that switches in response to switching of the differential pair to alternately switch a magnitude of each differential output voltage signal polarity and to alternately source current at each polarity of the differential output voltage signal; and a switched current sink, coupled to the differential output of the differential current supply to bias the differential current supply in a push-pull type arrangement, that switches out of phase relative to the differential current supply to alternately sink current at each polarity of the differential output voltage signal.

2. The mixer driver circuit of claim 1, wherein the differential current supply comprises a pair of emitter follower buffers.

3. The mixer driver circuit of claim 2, further comprising:
a pair of constant current sinks; and
a second pair of emitter follower buffers, biased by the pair of constant current sinks and coupled to the differential pair and the switched current sink, that provides a voltage level shifting drive for the switched current sink.

4. The mixer driver circuit of claim 1, wherein the switched current sink is biased by a constant current source and has a pair of control inputs coupled to respective polarities of the differential output voltage signal.

5. The mixer driver circuit of claim 1, wherein the switched current sink is biased by a constant current source and has a pair of control inputs coupled to respective polarities of the differential input of the differential pair.

6. The mixer driver circuit of claim 1, further comprising:
a second differential current supply, coupled to the differential pair and the switched current sink, that operates to switch the switched current sink based on switching of the differential pair.

7. The mixer driver circuit of claim 6, wherein:
the switched current sink having first and second control inputs; and
wherein the second differential current supply comprises a pair of emitter follower buffers, each biased by a constant current source, each having a control input driven by the differential pair and each having a current output for driving a respective one of the first and second control inputs of the switched current sink.

8. The mixer driver circuit of claim 1, wherein the differential pair comprises a resistive-loaded differential pair of transistors biased by a constant current sink.

9. The mixer driver circuit of claim 8, wherein the differential current supply comprises a pair of emitter follower buffers.

10. The mixer driver circuit of claim 9, further comprising:
second and third constant current sinks; and
a second pair of emitter follower buffers, biased by the second and third constant current sinks and coupled to the differential pair and the switched current sink, that provides a voltage level shifting drive for the switched current sink.

11. The mixer driver circuit of claim 9, wherein the switched current sink is biased by a constant current source and has a pair of control inputs coupled to respective polarities of the differential output voltage signal.

12. The mixer driver circuit of claim 9, wherein the switched current sink is biased by a constant current source and has a pair of control inputs coupled to respective polarities of the differential input of the differential pair.

13. A mixer driver circuit, comprising:
a first bipolar junction transistor (BJT) that has an emitter, a collector, and a base that receives a first polarity of a differential input signal;

a second BJT that has a collector, an emitter coupled to the emitter of the first BJT, and a base that receives a second polarity of the differential input signal;

a first current sink coupled between the common emitters of the first and second BJTs and a reference signal;

a first resistor having a first end coupled to a voltage source and a second end coupled to the collector of the first BJT;

a second resistor having a first end coupled to the voltage source and a second end coupled to the collector of the second BJT;

a third BJT having a collector coupled to the voltage source, a base coupled to the collector of the first BJT and an emitter for providing a first polarity of a differential output signal;

a fourth BJT having a collector coupled to the voltage source, a base coupled to the collector of the second BJT and an emitter for providing a second polarity of the differential output signal; and a switched current sink, coupled to the emitters of the third and fourth BJTs, that biases the third and fourth BJTs relative to the reference signal and that sinks current to drive the differential output signal.

14. The mixer driver circuit of claim 13, wherein the reference signal is ground.

15. The mixer driver circuit of claim 13, wherein the switched current sink comprises:
a fifth BJT having an emitter, a collector coupled to the emitter of the fourth BJT and a base coupled to the emitter of the third BJT;
a sixth BJT having a collector coupled to the emitter of the third BJT, a base coupled to the emitter of the fourth BJT and an emitter coupled to the emitter of the fifth BJT; and
a second current sink coupled between the common emitters of the fifth and sixth BJTs and the reference signal.

16. The mixer driver circuit of claim 15, wherein the reference signal is ground.

17. The mixer driver circuit of claim 13, wherein the switched current sink comprises:
a fifth BJT having an emitter, a collector coupled to the emitter of the fourth BJT and a base coupled to the base of the first BJT;
a sixth BJT having a collector coupled to the emitter of the third BJT, a base coupled to the base of the second BJT and an emitter coupled to the emitter of the fifth BJT; and
a second current sink coupled between the common emitters of the fifth and sixth BJTs and the reference signal.

18. The mixer driver circuit of claim 17, wherein the reference signal is ground.

19. The mixer driver circuit of claim 13, further comprising:
a third resistor having a first end coupled to the second end of the first resistor and a second end coupled to the collector of the first BJT;
a fourth resistor having a first end coupled to the second end of the second resistor and a second end coupled to the collector of the second BJT;
a fifth BJT having an emitter, a collector coupled to the voltage source and a base coupled to the collector of the first BJT;

a second current sink coupled between the emitter of the fifth BJT and the reference signal;

a sixth BJT having an emitter, a collector coupled to the voltage source and a base coupled to the collector of the second BJT;

a third current sink coupled between the emitter of the sixth BJT and the reference signal; and the switched current sink comprising:

a seventh BJT having an emitter, a collector coupled to the emitter of the fourth BJT and a base coupled to the emitter of the fifth BJT;

an eighth BJT having a collector coupled to the emitter of the third BJT, a base coupled to the emitter of the sixth BJT and an emitter coupled to the emitter of the seventh BJT; and a fourth current sink coupled between the common emitters of the seventh and eight BJTs and the reference signal.

20. The mixer driver circuit of claim 19, wherein the reference signal is ground.

* * * * *